United States Patent
Inamoto et al.

(10) Patent No.: US 10,068,762 B2
(45) Date of Patent: Sep. 4, 2018

(54) MANUFACTURE METHOD OF GATE INSULATING FILM FOR SILICON CARBIDE SEMICONDUCTOR DEVICE

(71) Applicant: FUJI ELECTRIC CO., LTD., Kawasaki-shi (JP)

(72) Inventors: Takuro Inamoto, Kawasaki (JP); Takeshi Fujii, Hino (JP); Mariko Sato, Fujisawa (JP)

(73) Assignee: FUJI ELECTRIC CO., LTD., Kawasaki-Shi (JP)

(*) Notice: Subject to any disclaimer, the term of this patent is extended or adjusted under 35 U.S.C. 154(b) by 0 days.

(21) Appl. No.: 15/398,429

(22) Filed: Jan. 4, 2017

(65) Prior Publication Data
US 2017/0243732 A1    Aug. 24, 2017

(30) Foreign Application Priority Data

Feb. 18, 2016  (JP) ................................ 2016-029238

(51) Int. Cl.
*H01L 21/00* (2006.01)
*H01L 21/02* (2006.01)
(Continued)

(52) U.S. Cl.
CPC ...... *H01L 21/0214* (2013.01); *H01L 21/6835* (2013.01); *H01L 29/1608* (2013.01);
(Continued)

(58) Field of Classification Search
CPC ............. H01L 21/0214; H01L 21/6835; H01L 29/1608; H01L 29/401; H01L 21/02178
See application file for complete search history.

(56) References Cited

U.S. PATENT DOCUMENTS

2014/0113402 A1* 4/2014 Bedell ................. H01L 31/0465
                                                                    438/93
2015/0041826 A1* 2/2015 Hekmatshoartabari ......................
                                                                    H01L 29/66068
                                                                    257/77

FOREIGN PATENT DOCUMENTS

JP         2015-031666 A      2/2015

OTHER PUBLICATIONS

Hino et al., "High channel mobility 4H-SiC metal-oxide-semiconductor field-effect transistor with low temperature metal-organic chemical-vapor deposition grown Al2O3 gate insulator," Applied Physics Letters (2008) vol. 92, pp. 183503-1-183503-2.

(Continued)

*Primary Examiner* — Richard Booth
(74) *Attorney, Agent, or Firm* — Rabin & Berdo, P.C.

(57) ABSTRACT

Providing a manufacture method of a gate insulating film formed on an SiC substrate having thereon an SiON film, achieving both of the maintenance of an SiON film structure and the formation of a high-quality insulating film. A manufacture method of a gate insulating film for an SiC semiconductor device comprises preparing a transfer plate comprising a transfer substrate and an insulating film formed thereon; preparing a surface-processed substrate comprising an SiC substrate and an epitaxial silicon oxynitride film as an atomic monolayer formed thereon; and transferring the insulating film from the transfer plate onto the silicon oxynitride film of the surface-processed substrate to produce the surface-processed substrate having a transferred insulating film.

11 Claims, 3 Drawing Sheets

(51) Int. Cl.
*H01L 21/683* (2006.01)
*H01L 29/16* (2006.01)
*H01L 29/40* (2006.01)

(52) U.S. Cl.
CPC ...... *H01L 29/401* (2013.01); *H01L 21/02178* (2013.01); *H01L 21/02249* (2013.01); *H01L 21/02255* (2013.01); *H01L 21/02266* (2013.01)

(56) References Cited

OTHER PUBLICATIONS

Tochihara et al., "The epitaxial crystalline silicon-oxynitride layer on SiC(0 0 0 1): Formation of an ideal SiC-insulator interface," Progress in Surface Science (2011) vol. 86 pp. 295-327.

* cited by examiner

MANUFACTURE METHOD OF GATE INSULATING FILM FOR SILICON CARBIDE SEMICONDUCTOR DEVICE

CROSS-REFERENCES TO RELATED APPLICATIONS

This application claims the benefit of Japanese Patent Application No. 2016-029238 filed Feb. 18, 2016, which is hereby incorporated by reference wherein in its entirety.

BACKGROUND OF THE INVENTION

Field of the Invention

The present invention relates to a formation of a gate insulating film on a silicon carbide substrate.

Description of the Related Art

In recent years, attention has been paid on silicon carbide (SiC) as a semiconductor material that can be used to produce a field-effect transistor having a higher pressure resistance and a lower loss when compared with conventional material such as silicon (Si) or gallium arsenide (GaAs).

In order to secure a lower loss, an interface status of an SiC/insulating film as a channel must be improved so as to increase a carrier mobility. Specifically, an interface m that has a high flatness and a lower trap level must be formed.

Currently, the thermal oxidation method has widely been used as a film formation method of a gate insulating film. With this method, however, it is difficult in principle to maintain the flatness and to sufficiently suppress an occurrence of the trap level. Actually, it has been known that a field-effect transistor with SiC produced by the thermal oxidation method has a channel mobility that is significantly lower than the bulk value of 1000 $cm^2/Vs$, more specifically about 50 $cm^2/Vs$ at most. Thus, the development of a method for controlling an interface status between a semiconductor and an insulating film to increase the channel mobility is one of important challenges for an SiC element having improved characteristics.

In order to cope with such a challenge, a deposition method has been growingly researched as a substitute method for the thermal oxidation method. The deposition method is a method employing a film formation apparatus for forming an insulating film on an SiC substrate. Thus, the formation of a favorable interface status can be expected in this method by appropriately processing a surface of a substrate in advance. Actually, a channel mobility higher than that of the thermal oxidation method in a formation of agate insulating film on an SiC with a deposition method was reported in S. Hino, T. Hatayama, J. Kato, E. Tokumitsu, N. Miura, T. Oomori, Applied Physics Letters 92 183503 (2008).

The deposition method is a superior method for performing an interface control. However, it is important for the deposition method to perform an appropriate processing of an SiC surface prior to a deposition as described above. An ideal surface status prior to a deposition is that the surface is flat at the atomic level and there is no chemically-active functional groups or dangling bonds. As an SiC surface structure that can realize such an ideal surface, an epitaxial silicon oxynitride film as an atomic monolayer (hereinafter may be referred to as an SiON film) has been known, the film being disclosed in H. Tochihara, T. Shirasawa, Progress in Surface Science 86 (2011) p. 295-327. In this technique an SiON film is formed on a 4H—SiC or 6H—SiC (0001) plane as an SiC crystal polymorphism belonging to the hexagonal system. The SiON film can be formed as a very thin insulating film having a thickness of about 0.6 nm composed of silicon atoms, oxygen atoms, and nitrogen atoms with a composition ratio (mole ratio) of 4:5:3, respectively. The SiON film has a structure including no dangling bonds and is chemically-inactive and is flat at the atomic level. Thus, the SiON film has an ideal SiC surface status prior to a deposition of a gate insulating film.

However, when a formation of an SiON film is followed by, for example, sputtering as a conventional deposition method to form a gate insulating film on the SiON film, a problem occurs that a very-thin SiON film structure may be broken in an initial deposition stage. The reason is that the sputtering principle requires atoms to collide with the substrate surface with high energy.

Chemical vapor deposition (hereinafter may be referred to as CVD) is also used as a general insulating film formation method. However, the CVD is disadvantageous in that an insulating film having a poor insulation quality tends to be formed, although the CVD has no problem in the surface loss as obtained in the sputtering. The reason is that a film formation in the CVD requires a chemical bonding of the film with a substrate surface but the SiON film is chemically-inactive.

Thus, such a deposition of a gate insulating film on an SiON film has been required that does not damage the SiON film and that realizes a formation of a high-quality insulating film.

Regarding a formation of a gate insulating film on an inactive surface, Japanese Patent Laid-Open No. 2015-31666 has reported that graphene is transferred onto silicon oxide (hereinafter referred to as $SiO_2$). However, as far as the knowledge of the inventors goes, no report has been conventionally made with regard to a formation of a gate insulating film on an SiON film.

SUMMARY OF THE INVENTION

Thus, an objective of the invention of this application is to provide a manufacture method of a gate insulating film by which a gate insulating film is formed on an SiC substrate having thereon an SiON film while achieving both of the maintenance of an SiON film structure and the formation of a high-quality insulating film.

The first embodiment of the present invention is a manufacture method of a gate insulating film for an SiC semiconductor device, comprising:
preparing a transfer plate (3) comprising a transfer substrate (1) and an insulating film (2a) formed thereon;
preparing a surface-processed substrate (6) comprising an SiC substrate (4) and an epitaxial silicon oxynitride film (5) as an atomic monolayer formed thereon; and
transferring the insulating film (2a) from the transfer plate (3) onto the silicon oxynitride film (5) of the surface-processed substrate (6) to produce the surface-processed substrate (6) having a transferred insulating film (2b).

According to the present invention, it is possible to form a high-quality gate insulating film while maintaining an ideal interface of an SiON film, thereby increasing a channel mobility of a field-effect transistor.

Further features of the present invention will become apparent from the following description of exemplary embodiments (with reference to the attached drawings).

DESCRIPTION OF THE EMBODIMENTS

Figure 1A:
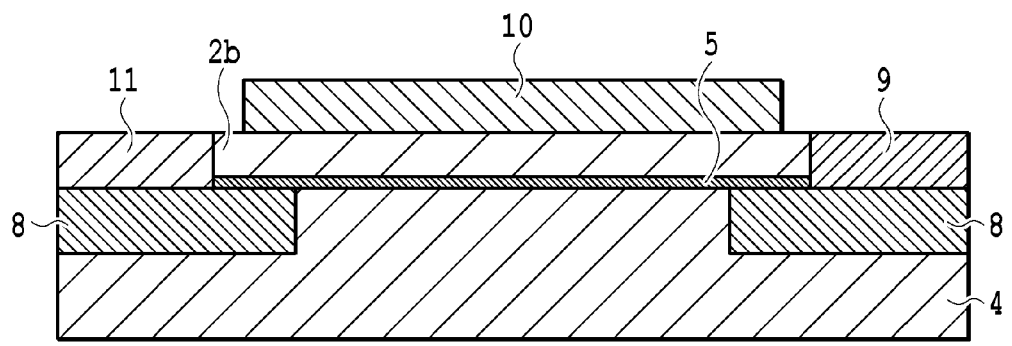
FIG. 1A is a typical schematic configuration diagram illustrating a silicon carbide semiconductor device that can be obtained by a method of the first embodiment of the present invention.

(I) First Embodiment of the Present Invention

A manufacture method of the first embodiment of the present invention comprises preparing a transfer plate (3) having thereon an insulating film (2a); preparing an SiC substrate (4) having thereon an epitaxial SiON film (5) as an atomic monolayer [surface-processed substrate (6)]; and transferring the insulating film (2a) from the transfer plate (3) onto the epitaxial SiON film (5) of the surface-processed substrate (6). The term "preparing" means a concept including not only the one produced by the party itself but also the one obtained from other producers.

When trying to form an insulating film on an epitaxial SiON film as an atomic monolayer, difficulties are faced in applying general film formation methods such as the sputtering method or the CVD method. It is because the SiON film has characteristics that the film is very thin and chemically-inactive, while the sputtering method causes a high surface damage during film formation, and the CVD method requires a formation of a chemical bonding with a surface on which a film is to be formed.

However, a transfer method is a method using physical adsorption between substances and can provide a formation of a high-quality film even onto a surface to which a general film formation method is difficult to be applied. Thus, the transfer method may eliminate the aforementioned disadvantages in principle, thus providing a film formation of a high-quality insulating film without damaging an SiON film.

The following section will describe typical embodiments of the present invention with reference to the drawings. The present invention is, however, not limited to such embodiments and can be appropriately modified within a range not departing from the intention thereof.

(I-1)

FIG. 1A illustrates an example of a field-effect transistor that can be obtained by a manufacture method of the first embodiment of the present invention. The field-effect transistor has a layered structure obtained by forming an epitaxial SiON film (5) as an atomic monolayer onto an SiC substrate (4), and further forming a gate insulating film (2b) onto the epitaxial SiON film (5) by the transfer method. A drain electrode (9), a gate electrode (10), a source electrode (11), and an $N^+$ layer (8) are also shown.

By a manufacture method of the first embodiment of the present invention, the flatness and the interface state suppression of an SiC substrate/insulating film interface are secured to provide a gate electrode having an increased channel mobility.

The above layered structure also can be applied to any semiconductor devices other than a field-effect transistor so long as the semiconductor device has a structure forming an SiC/insulating film interface.

(I-2)

Figure 2A:
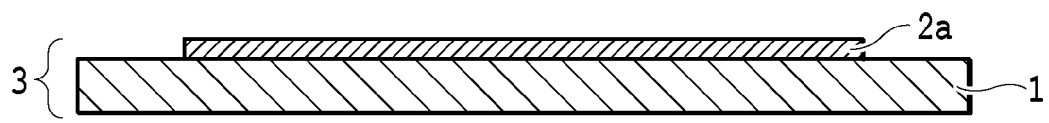
FIGS. 2A to 2C illustrate a step of forming an insulating film onto an SiON film by a transfer method as a process common in the first embodiment and the second embodiment of the present invention.
Figure 2B:
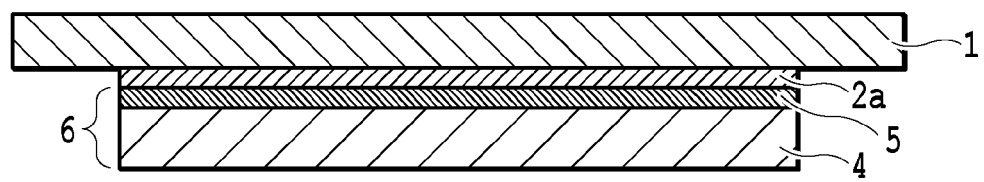
Figure 2C:
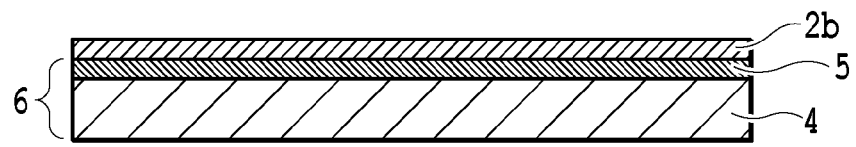

Next, FIGS. 2A to 2C illustrate a transfer procedure of the insulating film (2) in a manufacture method of the first embodiment of the present invention.

First, as shown in FIG. 2A, a transfer plate (3) comprising a transfer substrate (1) and an insulating film (2a) formed thereon is prepared. By adjustment of film forming conditions and application of a coating such as a mask, an insulating film having a desired film thickness and a desired planar dimension can be formed.

Next, an SiC substrate (4) having thereon an epitaxial SiON film (5) as an atomic monolayer [surface-processed substrate (6)] is separately prepared. As shown in FIG. 2B, the transfer plate (3) is adhered to the surface-processed substrate (6) so that the insulating film (2a) faces the SiON film (5). A force is evenly applied to the resultant structure with attention not to apply excess force so as to avoid a damage of the insulating film (2a). A load also may be optionally applied or a minute amount of pure water may be dripped onto adhered faces in order to improve adherence.

Next, as shown in FIG. 2C, the transfer substrate (1) of the transfer plate (3) is selectively removed to transfer the insulating film (2a) onto the SiON film (5) of the surface-processed substrate (6). In this selective removal, for example, an immersion into such a solution that selectively dissolves only the transfer substrate (1) removes sufficiently the transfer substrate (1). The solvent used for this process must have a property not to yield a chemical reaction with the insulating film.

Finally, organic solvent or pure water can be used to sufficiently wash and dry the produced sample, thereby providing an SiC substrate comprising an SiON film (5) and a transferred insulating film (2b) thereon.

(I-3)

An epitaxial SiON film (5) as an atomic monolayer can be formed on an SiC plane of an SiC substrate, the SiC plane being 4H—SiC or 6H—SiC (an SiC crystal polymorphism belonging to the hexagonal system) having sufficient flatness [see H. Tochihara, T. Shirasawa, Progress in Surface Science 86 (2011) p. 295-327].

Heating in a nitrogen atmosphere including oxygen can easily provide an SiON film on an SiC substrate. The resultant SiON film has an advantage that its structure is free from dangling bonds and thus an interface state is suppressed to be generated even after deposition of a gate insulating film.

The SiON has a high band-gap of about 8 eV. Thus, the SiON can be used as a buffer layer prior to deposition of an insulating film (2a). Thus, by forming an SiON film prior to deposition of an insulating film in an insulating film deposition process, an SiC/insulator interface can be formed that is flat and that has a suppressed interface state.

(I-4)

An insulating film (2a) to be transferred can be formed on a substrate for forming an insulating film, with a suitable film formation method selected in consideration of a desired film quality and a substrate material. For example, the CVD method, the atom layer deposition method, or the reactive deposition method can be used.

A profile of the substrate for forming an insulating film is not particularly limited. However, its surface on which an insulating film is to be formed has preferably flatness as high as possible and more preferably a surface roughness (Ra value) of 1 nm or less. The definition and measurement of the surface roughness (Ra value) will be described later (I-5).

A material of the substrate for forming an insulating film is also not particularly limited. However, from the viewpoint of providing an easy removal in a transfer operation, it is preferably a metal substrate, a $SiO_2$ substrate, a resin substrate, an inorganic salt substrate (e.g., NaCl substrate), etc.

The substrate for forming an insulating film may be directly used as transfer substrate (1) of the transfer plate (3) for transferring an insulating film onto an SiON film of an SiC substrate. However, the use of separate substrates for the substrate for forming an insulating film and for the transfer substrate (1) respectively is preferable since a substrate particularly suitable for an insulating film formation and a substrate particularly suitable for transferring onto an SiON film can be selectively used. For example, an inorganic salt substrate such as an NaCl substrate having a specific crystal plane as its surface may be suitable for the substrate for forming an insulating film since it is particularly characterized in its higher plane flatness. Moreover, the transfer substrate may be preferably composed of a material that can be softened such as thermoplastic resin from the viewpoint of providing an easy adherence operation during the transfer.

When two different substrates are selectively used as described above, an insulating film (2a) is firstly formed on a substrate for forming an insulating film, and subsequently the insulating film (2a) is transiently transferred onto a transfer substrate (1). Next, the insulating film (2a) on the transfer substrate (1) is transferred onto an SiON film of an SiC substrate [see for example (1-2) to (1-4) of a production example described later].

As another embodiment, even when a substance that can be softened is used as the substrate for forming an insulating film, an insulating film may be formed on the substrate in non-softened status and then it may be directly transferred from the same substrate in softened status as a transfer plate.
(I-5)

An insulating film (2a) prior to a transfer process has preferably a flat surface that is to be adhered, from the viewpoint of better adherence to an SiON film (5) or prevention of the insulating film from peel-off from the SiON film during the transfer process. The insulating film (2a) preferably has a surface roughness (Ra value) of 1 nm or less.

In order to obtain a surface having a low surface roughness (Ra value) as described in the section (I-4), it is preferred that a substrate for forming an insulating film has a surface flatness as high as possible on which an insulating film is to be formed, and that a suitable film formation method such as the CVD method, the atom layer deposition method, or the reactive deposition is used.

The term surface roughness (Ra value) means an arithmetic average roughness (a value obtained by calculating an average absolute values of deviations from arithmetic average value regarding heights of respective points on the surface profile). For example, the term surface roughness (Ra value) can be calculated by subjecting a sample surface image observed by an AFM (atom force microscope) or a white interferometer to a statistic processing to calculate an average value to all of the surface area picked up as a measurement target. More specifically, in the Example section, the AFM (SPA400 made by SII) was used with a 10 μm square measurement range.
(I-6)

From the viewpoint of securing a required insulation quality, an insulating film (2a) to be transferred is preferably designed in consideration of physical properties of an insulating material and/or a film thickness of the insulating film (2a).

Regarding a band-gap of the insulating material, an insulating material having a band-gap of at least 5 eV or more is preferably used in order to suppress a leak current, when considering that the band gap of 4H—SiC as SiC crystal polymorphism belonging to the hexagonal system is 3.26 eV. Preferred insulating material is exemplified by silica ($SiO_2$) or metal oxides such as aluminum oxide ($Al_2O_3$), hafnium oxide ($HfO_2$), or lanthanum oxide ($La_2O_3$), although not limited to these materials.

Similarly, from the viewpoint of suppressing a leak current, an amorphous insulating film is preferably used as the insulating film (2a). However, even a crystalline insulating film can be used so long as the film has a favorable crystallinity.

Furthermore, the insulating film (2a) to be transferred preferably has a film thickness of 10 nm or more from the viewpoints of a sufficient pressure resistance during gate voltage application and leak current suppression, while preferably has a film thickness of 150 nm or less from the viewpoints of securing an electric field in an insulating film during gate voltage application and sufficient formation of an inversion layer.

(II) Second Embodiment of the Present Invention

Figure 3:
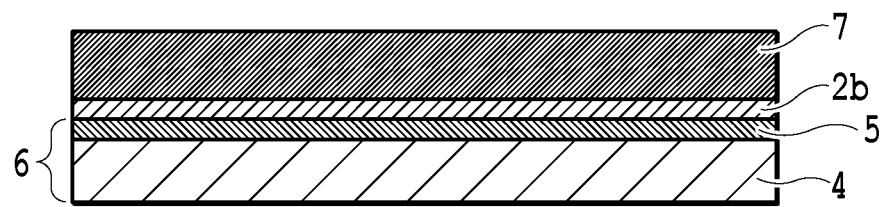
FIG. 3 illustrates a step of further forming a deposited insulating film onto a transferred insulating film on the SiON film in the method of the second embodiment of the present invention.

A manufacture method of the second embodiment of the present invention is an embodiment that has, in addition to the manufacture steps of the first embodiment of the present invention, a step of using a deposition method to deposit an insulating film (a deposited insulating film) (7) onto the transferred insulating film (2b) on a surface of the epitaxial SiON film (5) as an atomic monolayer (see FIG. 3).
(II-1)

Figure 1B:
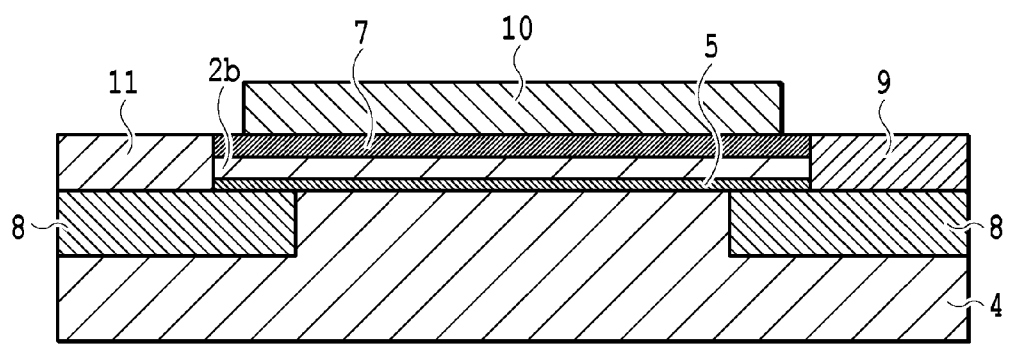
FIG. 1B is a typical schematic configuration diagram illustrating a silicon carbide semiconductor device that can be obtained by a method of the second embodiment of the present invention.

FIG. 1B illustrates an example of a field-effect transistor that can be obtained by a manufacture method of the second embodiment of the present invention. The field-effect transistor has a layered structure obtained by forming an epitaxial SiON film (5) as an atomic monolayer on the SiC substrate (4), further forming a transferred gate insulating film (2b) occupying a part of total thickness of gate insulating films on the epitaxial SiON film (5) by a transfer method, and further forming a deposited gate insulating film (7) occupying the remaining part of total thickness of gate insulating films on the transferred gate insulating film (2b) by a deposition method. The drain electrode (9), the gate electrode (10), the source electrode (11), and the $N^+$ layer (8) are also shown.

By a manufacture method of the second embodiment of the present invention, the flatness and the interface state suppression of an SiC substrate/insulating film interface are secured to provide a gate electrode having an increased channel mobility, such technical effect being similar to the first embodiment of the present invention.

The above layered structure also can be applied to any semiconductor devices other than a field-effect transistor so long as the semiconductor device has a structure forming an SiC/insulating film interface.

(II-2)

According to this embodiment, not only the transferred insulating film (2) but also the deposited insulating film (7) may contribute to a total thickness of insulating films. Thus, the embodiment can be more preferably used in particular for a case where the transferred insulating film (2b) itself is relatively thin (e.g., a film thickness lower than 10 nm).

This embodiment provides a technical effect similar to that provided by the first embodiment of the present invention because, prior to formation of a deposited insulating film (7), a transferred insulating film (2b) is formed on an SiON film (5) and thus the transferred insulating film (2b) functions as a protection film of the SiON film (5) against a process such as sputtering, and chemical bonding of a substrate surface can be obtained for a process such as the CVD method.

From the viewpoint as described above, the transferred insulating film (2b) preferably has a film thickness of 5 nm or more, but may have a film thickness of 10 nm or more.
(II-3)

The film formation method that can be used to form a deposited insulating film (7) is not particularly limited. However, the deposition film formation method such as the CVD method, the atom layer deposition method, or the reactive deposition method can be exemplified.

When considering that 4H—SiC as an SiC crystal polymorphism belonging to the hexagonal system has a band-gap of 3.26 eV, an insulating material that can be used to form a deposited insulating film (7) is preferably an insulating material having a band-gap of at least 5 eV or more for suppressing a leak current. Preferred insulating materials include metal oxides such as silica ($SiO_2$), aluminum oxide ($Al_2O_3$), hafnium oxide ($HfO_2$) and lanthanum oxide ($La_2O_3$), although not limited to these materials.

Similarly, from the viewpoint of suppressing a leak current, an amorphous insulating film is preferably used. However, crystalline insulating film also may be used so long as the film has a favorable crystallinity.

The material of the deposited insulating film (7) as described above does not always have to be the same as the material of the transferred insulating film (2b). However, from the viewpoint of securing gate reliability, the material has preferably a high insulation quality to reduce the leak.

Furthermore, total film thickness of a deposited insulating film (7) and a transferred insulating film (2b) is preferably 10 nm or more from viewpoints of a sufficient pressure resistance during gate voltage application and leak current suppression, while is preferably 150 nm or less from viewpoints of securing an electric field in an insulating film during gate voltage application and sufficient formation of an inversion layer.

Production Example 1

This example is a typical example of a manufacture method of the first embodiment of the present invention.
(1-1) Formation of Epitaxial SiON Film as Atomic Monolayer onto SiC Substrate (Production of Surface-Processed Substrate)

An SiC substrate was prepared that was cut to have a 10 mm square shape, having a thickness of 350 μm and an angle of 4° (off angle) from a 4H—SiC (00001) plane.

This substrate was subjected to an ultrasonic cleaning by organic solvent such as acetone or ethanol for 10 minutes and another ultrasonic cleaning by pure water for 10 minutes, respectively, thereby removing impurities on the surface.

Next, the cleaned substrate was placed on a graphite-made susceptor provided in a horizontal furnace and was subjected to evacuation of air until the vacuum degree in the furnace reached $10^{-3}$ Pa.

After the evacuation of air, hydrogen gas was introduced into the furnace until an atmospheric pressure was reached. Then, the substrate was heated for 20 minutes at a hydrogen gas flow rate of 1000 sccm and a temperature of 1400 degrees C., thereby the SiC surface was planarized.

After the heating, the substrate was cooled for 15 minutes until the substrate temperature reached a room temperature. Then, the hydrogen gas flow was stopped. Then, the evacuation of gas was performed until the vacuum degree in the furnace reached $10^{-3}$ Pa.

Next, nitrogen gas was introduced into the furnace until an atmospheric pressure was reached. Then, the substrate was heated for 20 minutes at a nitrogen gas flow rate of 1000 sccm and a temperature of 1400 degrees C., thereby growing an SiON film. During this process, the furnace included a minute amount of oxygen.

After the heating, the substrate was cooled for 15 minutes until the substrate temperature reached a room temperature. Then, the nitrogen gas flow was stopped. The heating furnace was exposed to air. Then, the resultant surface-processed substrate was taken out.
(1-2) Formation of Amorphous $Al_2O_3$ Film (Insulating Film) on NaCl Substrate (Substrate for Forming Insulating Film)

As a substrate for forming an insulating film, an NaCl (001) substrate (made by MTI) was prepared that had a 10 mm square shape and a thickness of 500 μm. The substrate had a surface roughness (Ra value) of 0.5 nm.

An amorphous $Al_2O_3$ film was formed on the substrate with sputtering.

Specifically, the substrate was firstly subjected to, prior to film formation, a UV ozone processing at 300 degrees C., thereby removing organic impurities attached to a surface of the substrate.

Next, the substrate was placed on a sample stand provided in a helicon radio-frequency magnetron sputtering apparatus, and the apparatus was evacuated until $10^{-3}$ Pa was reached. Next, argon gas at a flow rate of 10 sccm and oxygen gas at a flow rate of 1 sccm were introduced into the chamber.

Thereafter, the pressure in the chamber was adjusted to 1 Pa. Then, aluminium sputtering was performed for 2 minutes at a substrate temperature of 300 degrees C. and a cathode power of 150 W, thereby forming an $Al_2O_3$ film having a surface roughness (Ra value) of 0.5 nm and a film thickness of 50 nm.

The gas flow rate unit "sccm" in the description means reference $cm^3$/minute based on 1 atm and 0 degrees C. as a reference.

The surface roughness (Ra value) was measured for a 10 μm square region with an atom force microscope (AFM made by SII, SPA400). The film thickness was measured by observing a cross-section with an electron scanning microscope (SEM S-4700 made by Hitachi High-Technologies Corporation).

The $Al_2O_3$ band-gap is 6 eV or more.
(1-3) Production of Polymethylmethacrylate Film (Transfer Plate) Having Thereon Amorphous $Al_2O_3$ Film (Insulating Film)

On a surface of the $Al_2O_3$ film formed on the NaCl substrate produced in the above section (1-2), 20 μL of dichlorobenzene solution (10 weight % solution) of polymethylmethacrylate (hereinafter referred to as PMMA) was dripped and spin coating was performed at a rotation number of 4000 rpm (rotation number/minute) for 60 seconds.

Thereafter, the sample was dried at 40 degrees C. for 30 minutes, thereby forming a PMMA film having a film thickness of 50 μm on a surface of the $Al_2O_3$ film. Next, the sample was immersed in 200 mL of pure water having a temperature of 50 degrees C., thereby removing the NaCl substrate completely.

Next, the sample was subjected to washing with running pure water for 5 minutes and drying, thereby providing an $Al_2O_3$ film transferred to the PMMA film as a transfer substrate.

(1-4) Transfer of Amorphous $Al_2O_3$ Film (Insulating Film) onto Epitaxial SiON Film The transfer plate obtained in the above section (1-3) (the PMMA film having thereon an $Al_2O_3$ film) was pressed onto the surface-processed substrate produced in the above section (1-1) (the SiC substrate having thereon an SiON film) so that the $Al_2O_3$ film may face the SiON film surface.

Thereafter, the sample was heated under conditions of 180 degrees C. for 30 minutes to soften the PMMA film and to facilitate an adherence of the $Al_2O_3$ film onto the SiON film.

Thereafter, the sample was immersed in acetone for 5 minutes to remove the PMMA film, thereby finally providing an SiC substrate having thereon the $Al_2O_3$ film.

(1-5) Production of MOS Capacitor for Evaluation of Film Quality

A mask for forming an electrode pad was covered over the $Al_2O_3$ film of the sample produced in the section (1-4) (the SiC substrate having an $Al_2O_3$ film transferred onto an SiON film) and the resultant structure was placed on the sample stand of a resistance heating evaporation apparatus.

Next, aluminium (Al) as raw material was provided on a heating board. The chamber was evacuated until the interior of the chamber reached $10^{-4}$ Pa. At this pressure, the aluminium vapor deposition was performed for 200 seconds at a speed of 5 Å/second.

After the vapor deposition, the interior of the chamber was exposed to air and the sample was taken out, thus obtaining a sample provided with an aluminium electrode having a diameter of 200 μm and a thickness of 100 nm was formed on the $Al_2O_3$ film surface.

A back face electrode was formed by removing a natural oxidation film from a range of 5 mm×10 mm of the sample back face with a diamond pen, and subsequently vapor-depositing aluminum over the range without a mask.

The sample obtained through the above steps is referred to as production sample 1.

Production Example 2

This is a typical and specific example of a manufacture method of the second embodiment of the present invention.

(2-1) Production of SiC Substrate Having Transferred $Al_2O_3$ Film on SiON Film An SiC substrate having an transferred $Al_2O_3$ film on an SiON film was produced by a manner according to the sections (1-1) to (1-4) of the production example 1 except that the film thickness of the $Al_2O_3$ film produced by the sputtering film formation [(1-2)] in the method of the production example 1 was changed to 5 nm.

(2-2) Formation of Deposited $Al_2O_3$ Film on Transferred $Al_2O_3$ Film

A deposited $Al_2O_3$ film having a film thickness of 50 nm was formed on the transferred $Al_2O_3$ film having on the SiC substrate in the section (2-1), by sputtering according to the section (1-2) of the production example 1.

(2-3) Production of MOS Capacitor for Evaluation of Film Quality

The sample produced in the section (2-2) was used to produce a MOS capacitor for evaluation of film quality according to the section (1-5) of the production example 1. The MOS capacitor is referred to as production sample 2.

Production Example 3

A MOS capacitor for evaluation of film quality was produced according to the production example 1 except that the material of the insulating film formed by sputtering in the production example 1 [the above section (1-2)] was changed to an amorphous $SiO_2$ film. The MOS capacitor is referred to as production sample 3.

The $SiO_2$ band-gap was 3.6 eV.

Production Example 4

A MOS capacitor for evaluation of film quality was produced according to the production example 1 except that the film thickness of the $Al_2O_3$ film formed by sputtering in the production example 1 [the above section (1-2)] was changed to 3 nm. The MOS capacitor is referred to as production sample 4.

Production Example 5

A MOS capacitor for evaluation of film quality was produced according to the production example 1 except that a post-processing step was added in which the $Al_2O_3$ film formed on a substrate for forming an insulating film in the above section (1-2) of the production example 1 was subjected to hydrogen plasma irradiation to adjust the surface roughness (Ra value) of the $Al_2O_3$ film to 2 nm. The MOS capacitor is referred to as production sample 5.

Production Example 6

The SiON film on the SiC substrate produced in the above section (1-1) of the production example 1 was directly subjected to sputtering according to the section (1-2) to form an $Al_2O_3$ film having a film thickness of 50 nm. Thereafter, a MOS capacitor for evaluation of film quality was produced according to the section (1-5). The MOS capacitor is referred to as production sample 6.

Production Example 7

An $Al_2O_3$ film having a film thickness of 50 nm was directly formed on the SiON film of the SiC substrate produced in the above section (1-1) of the production example 1, by the CVD method. Thereafter, a MOS capacitor for evaluation of film quality was produced according to the section (1-5). The MOS capacitor is referred to as production sample 7.

Production Example 8

A MOS capacitor for evaluation of film quality was produced according to the production example 2 except that an $SiO_2$ film having a film thickness of 50 nm was formed by sputtering on the transferred $Al_2O_3$ film in the section (2-2) of the production example 2. The MOS capacitor is referred to as production sample 8.

Production Example 9

A MOS capacitor for evaluation of film quality was produced according to the production example 2 except that an SiO$_2$ film having a film thickness of 3 nm was formed by sputtering on the transfer Al$_2$O$_3$ film in the section (2-2) of the production example 2. The MOS capacitor is referred to as production sample 9.

(Performance Evaluation 1)

The production samples 1 and 3 to 7 were evaluated with regard to existence or nonexistence of peel-off of a transferred insulating film with the surface SEM observation, leak current at a gate application voltage of 5V, and interface state density of a forbidden band of 0.2 eV under a conductance band with the capacitance-voltage characteristic measurement (hereinafter referred to as a C-V measurement), respectively.

The results thereof are shown in Table 1.

TABLE 1

|  | Peel-off of transferred insulating film | Leak current | Interface state density (cm$^{-2}$ eV$^{-1}$) |
|---|---|---|---|
| Production sample 1 | No | 1 pA or less | 3.3 × 10$^{11}$ |
| Production sample 3 | No | 1 µA or more | not evaluable |
| Production sample 4 | No | 1 µA or more | not evaluable |
| Production sample 5 | Yes | not evaluable | not evaluable |
| Production sample 6 | No | 1 pA or less | 2.1 × 10$^{12}$ |
| Production sample 7 | No | 1 µA or more | not evaluable |

Observation was made with the electron scanning microscope (SEM) to determine whether a peel-off was present or not.

The sample was placed on a metal stage and an upper face electrode was allowed to touch a measurement probe(p-rober), thereby measuring a leak current in the vertical direction of the substrate. The wording "not evaluable" leak current means unsuccessful formation of an electricity measurement electrode just over the transferred insulation film, the unsuccessful formation being caused by the peel-off of the transferred insulating film.

The interface state density was evaluated by obtaining a capacitance value-voltage curve from the C-V measurement with the setup similar to that used in the measurement of the leak current, and subsequently calculating the state density based on the measurement curve with an analysis method called a Ho-Lo method.

According to the results, the production sample 1 showed a favorable adherence to an SiON film with a uniform formation of a transferred insulating film (or no peel-off of a transferred insulating film), a favorable pressure resistance of a formed transferred insulating film (the leak current of 1 pA or less), and little damage on an SiON film (the interface state density of 5×10$^{11}$ cm$^{-2}$ eV$^{-1}$ or less). This demonstrates that advantageous effects are provided by the manufacture method of the first embodiment of the present invention.

When SiO$_2$ having a relatively-poor insulation quality was used as insulating material for constituting the insulating film (production sample 3) or when Al$_2$O$_3$ was used as an insulating material but the insulating film had a relatively-thin film thickness (production sample 4), the resultant leak current was relatively high. This demonstrates that high insulation quality of an insulation material and sufficient film thickness of an insulation film are preferable.

In the case of the production sample 5 in which the surface roughness of an insulating film prior to a transfer process was intentionally increased, the peel-off of a transferred insulating film was observed. This demonstrates a smoother surface is preferable for the surface of an insulating film prior to a transfer process (the surface to be adhered to an SiON film by a transfer process).

When the transfer method as in the present invention was substituted with the sputtering method alone to form an insulating film on an SiON film (production sample 6), the results showed a high interface state density and a high damage on an SiON film.

When the transfer method as in the present invention was substituted with the CVD method alone to form an insulating film on an SiON film (production sample 7), the results showed increased leak current, and it demonstrates that a formed insulating film had a poor insulation quality.

(Performance Evaluation 2)

The production samples 2, 8 and 9 were evaluated as in the performance evaluation 1. The results thereof are shown in Table 2.

TABLE 2

|  | Peel-off of transfer insulating film | Leak current | Interface state density (cm$^{-2}$ eV$^{-1}$) |
|---|---|---|---|
| Production sample 2 | No | 1 pA or less | 3.5 × 10$^{11}$ |
| Production sample 8 | No | 1 µA or more | not evaluable |
| Production sample 9 | No | 1 µA or more | not evaluable |

According to the results, the production sample 2 showed a favorable adherence to an SiON film, a uniform formation of a transferred insulating film (or no peel-off of a transferred insulating film), a favorable pressure resistance of a formed transferred insulating film (the leak current of 1 pA or less), and little damage on an SiON film (the interface state density of 5×10$^{11}$ cm$^{-2}$ eV$^{-1}$ or less). This demonstrates that advantageous effects are also provided by a manufacture method of the second embodiment of the present invention.

When SiO$_2$ having a relatively-poor insulation quality was used as an insulating material for constituting a deposited insulating film (production sample 8); or when Al$_2$O$_3$ was used as an insulating material for a deposited insulating film, but the film consisting of a deposited- and transferred- insulating films was relatively thin (production sample 4), resultant leak currents were relatively high. This demonstrates that high insulation quality of an insulation material and sufficient film thickness of an insulation film are preferable.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A manufacture method of a gate insulating film for an SiC semiconductor device, comprising:
   preparing a transfer plate comprising a transfer substrate and an insulating film formed thereon;
   preparing a surface-processed substrate comprising an SiC substrate and an epitaxial silicon oxynitride film as an atomic monolayer formed thereon; and
   transferring the insulating film from the transfer plate onto the silicon oxynitride film of the surface-processed substrate to produce the surface-processed substrate having a transferred insulating film, wherein the insulating film has a surface roughness prior to the transferring (Ra value) of 1 nm or less, and the silicon oxynitride film is comprised of silicon atoms, oxygen atoms, and nitrogen atoms with a composition ratio (mole ratio) of 4:5:3 respectively.

2. The manufacture method of a gate insulating film for an SiC semiconductor device according to claim 1, wherein:
the transfer substrate is composed of a material that can be softened; and
the transferring is performed by adhering the transfer plate to the surface-processed substrate so that the insulating film faces the silicon oxynitride film while the material is in a softened status.

3. The manufacture method of a gate insulating film for an SiC semiconductor device according to claim 1, wherein a material of the insulating film to be transferred has a band-gap of 5.0 eV or more.

4. The manufacture method of a gate insulating film for an SiC semiconductor device according to claim 1, wherein the insulating film to be transferred has a film thickness of 10 nm to 150 nm.

5. The manufacture method of a gate insulating film for an SiC semiconductor device according to claim 1, wherein a deposition method is used to further deposit an insulating film (a deposited insulating film) onto the transferred insulating film on the silicon oxynitride film.

6. The manufacture method of a gate insulating film for an SiC semiconductor device according to claim 5, wherein a material of the deposited insulating film has a band-gap of 5.0 eV or more.

7. The manufacture method of a gate insulating film for an SiC semiconductor device according to claim 4, wherein the total thickness of the deposited insulating film and the transferred insulating film is 10 nm to 150 nm.

8. The manufacture method of a gate insulating film for a SiC semiconductor device according to claim 2, wherein the insulating film is comprised of one of a metal oxide including an aluminum oxide ($Al_2O_3$) a hafnium oxide ($HfO_2$), and a lanthanum oxide ($La_2O_3$).

9. A manufacture method of a gate insulating film for a SiC semiconductor device, comprising:
preparing an insulating film forming plate including an insulating film forming substrate and an insulating film, the insulating film forming substrate being comprised of one of a resin and an inorganic salt, the insulating film being formed on the insulating film forming substrate,
preparing a surface-processed substrate including a SiC substrate and an epitaxial silicon oxynitride film as an atomic monolayer formed thereon; and
transferring the insulating film from the insulating film forming substrate onto the silicon oxynitride film of the surface-processed substrate to form the surface-processed substrate having a transferred insulating film.

10. The manufacture method of a gate insulating film for a SiC semiconductor device according to claim 9, wherein the inorganic salt is NaCl.

11. A manufacture method of a gate insulating film for a SiC semiconductor device, comprising:
preparing an insulating film forming plate including an insulating film forming substrate and an insulating film, the insulating film forming substrate being comprised of one of $SiO_2$, a resin and an inorganic salt, the insulating film being formed on the insulating film forming substrate,
transferring the insulating film from the insulating film forming substrate to a transfer substrate to form a transfer plate;
preparing a surface-processed substrate including a SiC substrate and an epitaxial silicon oxynitride film as an atomic monolayer formed thereon; and
transferring the insulating film from the transfer substrate onto the silicon oxynitride film of the surface-processed substrate to form the surface-processed substrate having a transferred insulating film.

* * * * *